United States Patent
Meyer et al.

(10) Patent No.: US 7,277,965 B2
(45) Date of Patent: Oct. 2, 2007

(54) APPARATUS AND METHODS FOR THE AUTOMATED CREATION OF DISTRIBUTED CONFIGURATION STORAGE

(75) Inventors: James W Meyer, Shoreview, MN (US); Jake Klier, Blaine, MN (US)

(73) Assignee: Micron Technology Corp., Boise, ID (US)

( * ) Notice: Subject to any disclaimer, the term of this patent is extended or adjusted under 35 U.S.C. 154(b) by 0 days.

(21) Appl. No.: 10/932,848

(22) Filed: Sep. 1, 2004

(65) Prior Publication Data
US 2005/0033870 A1    Feb. 10, 2005

Related U.S. Application Data

(62) Division of application No. 10/329,742, filed on Dec. 23, 2002.

(51) Int. Cl.
*G06F 3/00* (2006.01)
*G06F 13/12* (2006.01)
*G06F 17/50* (2006.01)
*G06F 13/28* (2006.01)

(52) U.S. Cl. .............. 710/8; 710/10; 710/12; 710/62; 716/3; 716/4; 716/18

(58) Field of Classification Search ........ 716/3, 716/4, 18; 710/8, 10, 12, 62
See application file for complete search history.

(56) References Cited

U.S. PATENT DOCUMENTS

| | | | |
|---|---|---|---|
| 5,832,238 A | 11/1998 | Helms | 395/285 |
| 5,875,351 A | 2/1999 | Riley | 395/842 |
| 5,995,736 A * | 11/1999 | Aleksic et al. | 716/18 |
| 6,073,233 A | 6/2000 | Chapman | |
| 6,154,048 A | 11/2000 | Iwanczuk et al. | |
| 6,275,888 B1 | 8/2001 | Porterfield | |
| 6,453,448 B1 * | 9/2002 | Meyer | 716/4 |
| 6,457,091 B1 | 9/2002 | Lange et al. | 710/314 |
| 6,459,646 B1 | 10/2002 | Yee et al. | 365/230.03 |
| 6,539,520 B1 * | 3/2003 | Tiong et al. | 716/3 |
| 6,862,563 B1 * | 3/2005 | Hakewill et al. | 716/18 |
| 6,934,934 B1 * | 8/2005 | Osborne et al. | 717/126 |
| 2002/0147868 A1 | 10/2002 | Tsai | |
| 2003/0131325 A1 * | 7/2003 | Schubert et al. | 716/4 |

(Continued)

OTHER PUBLICATIONS

Chuck Benz, csrGen: Automated CSRs for ASCI/FPGA Processir Interfaces, pp. 1-13.*

(Continued)

*Primary Examiner*—Kim Huynh
*Assistant Examiner*—Joshua D. Schneider
(74) *Attorney, Agent, or Firm*—Fish & Neave IP Group Ropes & Gray LLP

(57) ABSTRACT

Systems and methods for providing distributed configuration storage are presented. The configuration storage is divided into distributed configuration target modules that are physically located in each design section of a device that uses configuration storage. A distributed configuration master module, physically located near the host interface, controls access into and out of each target module via a distributed configuration bus. The creation of each storage array in the distributed configuration storage can be automated using a scripting tool that converts each register specification into hardware description language code.

22 Claims, 10 Drawing Sheets

U.S. PATENT DOCUMENTS

2003/0159124 A1*  8/2003  Fisher .................. 716/18
2004/0025086 A1    2/2004  Gorday et al.

OTHER PUBLICATIONS

"Automated CSRs for ASIC/FPGA Processor Interfaces," http://asics.chuckbenz.com/csrGenWhitePaper.html (undated, downloaded Oct. 9, 2002).

"Custon-Touch ASAP," *Virage Logic*, http://www.viragelogic.com/products/datasheets/ASAP_Bro.pdf (2002, downloaded Dec. 23, 2002).

Document at http://asics.chuckbenz.com/csrGen.txt (undated, downloaded Oct. 9, 2002).

"Engineer writes open-source register generation tool," *EE Times*, http://www.eetimes.com/story/OEG20020905S0035 (Sep. 9, 2002).

"Memory Compilers," *Virage Logic*, http://www.viragelogic.com/products/compilers/index.jsp (2002, downloaded Dec. 23, 2002).

Hennessy, John L. et al, "Computer Architecture, A Quantitative Approach," Morgan Kaufmann, Third Edition, pp. 698-720, 2002.

Com2000 Solutions Limited, RAID Storage Sub-System, http://www.com2000.com.hk/raid_system.htm, Nov. 13, 2000.

* cited by examiner

APPARATUS AND METHODS FOR THE AUTOMATED CREATION OF DISTRIBUTED CONFIGURATION STORAGE

CROSS-REFERENCE TO RELATED APPLICATION

This is a division of copending, commonly-assigned U.S. patent application Ser. No. 10/329,742, filed Dec. 23, 2002.

BACKGROUND OF THE INVENTION

This invention relates to computer systems. More particularly, this invention relates to computer Systems having configuration storage.

A computer system typically includes a processor, a memory, and a plurality of peripheral devices. These peripheral devices include, for example, keyboards, mice, display monitors, storage devices such as hard disk drives and compact-disk read-only-memories (CD-ROMs), printers, video cards, audio cards, modems, small computer system interfaces (SCSIs), universal serial buses (USBs), memory controllers, and other chips or chipsets. These peripheral devices are typically connected to one or more buses that allow the peripheral devices to interface with the system processor and memory to perform certain functions.

A computer system typically employs at least one bus system architecture for interfacing the peripheral devices with the system processor and memory. Such bus system architectures include, for example, the Industry Standard Architecture (ISA), Extended ISA (EISA), and Peripheral Component Interconnect (PCI) architecture. ISA and EISA are older bus architectures that handle less data bits at a slower clock speed than the PCI architecture. For example, ISA can handle 16-bit data transfers at a clock speed of 8 Megahertz (MHz). EISA can handle 32-bit data transfers at a clock speed of 8 MHz. PCI, however, can handle 32-bit or 64-bit data transfers at a clock speed of 33 MHz.

In particular, the PCI architecture specifies a PCI local bus that connects the processor, memory, and PCI compatible devices to a wider and faster data pathway. The PCI devices that interface with the PCI local bus include a variety of chips or chipsets that perform specialized functions. PCI devices include, for example, modems, video cards, audio cards, SCSIs, Northbridge devices, PCI-to-PCI bridges, USBs, memory controllers, and Local Area Network (LAN) adapters. These PCI devices can be integrated onto the main circuit board of the computer or can be added as expansion cards that fit into PCI slots connected to the PCI bus. A PCI bus can typically support three to five PCI devices.

Each PCI device includes its own configuration information. In addition to PCI devices, other devices in a computer system also include their own configuration information including, for example, devices compatible with other bus architectures (e.g., ISA, EISA), a memory-mapped input-output (I/O) space, and any addressable register block (e.g., central processing unit registers). This configuration information is typically provided in a centralized configuration storage that includes one or more address spaces, with each address space having a suitable number of bytes of addressable memory organized as configuration registers. For example, each address space in a PCI device includes 256 bytes of addressable memory organized as configuration registers. The configuration registers provide a computer system with information about the device and allow the device to be configured for use in a specific system.

Each device typically includes one or more design sections that use configuration storage to perform different functions, and in many instances, to interface with other components in the computer system. Configuration storage, which is accessed by a host interface on the device, is typically organized as a single design entity located in close physical proximity to the host interface. Data stored in configuration storage are then communicated to individual design sections that may be a considerable distance from the host interface. Global routing resources are then needed to route each configuration bit to the design section in which they are used, resulting in excessive routing resources. For example, a configuration bus containing a collection of signal wires (e.g., often hundreds or thousands) can be used to transfer a configuration bit from the centralized configuration storage to each design section. This can cause layout and timing problems in programmable logic device (PLD) designs, application-specific integrated circuit (ASIC) designs, and field-programmable gate array (FPGA) designs.

The design of a device typically includes the creation of a functional model using a hardware description language (HDL) such as Very High Speed Integrated Circuit Hardware Description Language (VHDL) or Verilog. The HDL code represents hardware information of the device (e.g., registers, control logic), which can then be compiled into a gate level-description that describes the device in terms of logic gates (e.g., AND gates, OR gates, exclusive OR (XOR) gates, inverters) and interconnections. This gate-level description can then be imported into a place-and-route tool that generates a netlist describing the electrical connectivity data associated with the device. The place-and-route process, also referred to as layout, represents the physical location of each transistor that makes up a logic gate and the interconnections between each logic gate on a semiconductor chip. The netlist data can then be used to drive fabrication of the device on the chip.

With current technologies that create devices using HDL, configuration storage is created manually. Because configuration registers are each customizable to one of several different classifications of registers, known methods require a user to manually describe each register in HDL code in order to customize those registers. This can be a laborious process that can lead to logic design errors in interpreting the configuration register specifications. Also, configuration registers not used in a device can have unconnected inputs and outputs that can lead to problems with place-and-route tools. Furthermore, test code for simulating test patterns in configuration storage is also manually created, thus also prone to errors.

In view of the foregoing, it would be desirable to improve the layout efficiency and logic design accuracy of providing configuration storage in devices.

SUMMARY OF THE INVENTION

It is an object of this invention to improve the layout efficiency and logic design accuracy of providing configuration storage in devices.

In accordance with the invention, systems and methods for providing distributed configuration storage are presented. Configuration storage, which includes one or more address spaces each having a suitable number of bytes of addressable memory organized as configuration registers, is divided into distributed configuration target (DCFGT) modules that are physically located in each design section of a device that uses configuration information. Each target module can include the same registers from the same address space, different registers from the same address space, registers from different address spaces, or any combination thereof.

A distributed configuration master (DCFGM) module physically located near a host (e.g., a processor) controls access into and out of each target module. The master module translates requests from a host into distributed configuration (DCON) bus commands (e.g., read and write commands) for transfer to a specified target module via a DCON bus. The DCON bus advantageously needs only a small number of wires (e.g., 20) to interconnect design sections in comparison to the large number (typically hundreds or thousands) of wires needed in a known configuration (CONFIG) bus with centralized configuration storage.

Each target module includes a DCON bus interface and at least one storage array. A storage array includes one or more registers associated with the design section that the storage array resides in. More than one storage array may be associated with the design section. In addition, a configuration register may be shared by more than one design section or device. Each register bit in the storage array can be configured as one of several different register classifications. The DCON bus interface translates the DCON bus commands into signals that access one of the registers in one of the storage arrays. Configuration data from the storage array can then be sent out of the target module through an output port via a CONFIG bus for use by the surrounding design section. The invention improves the efficiency of place-and-route tools by reducing the number of wires that interconnect design sections (e.g., by using a DCON bus). In addition, because the is configuration registers reside locally in each design section, the length of the CONFIG bus connections are reduced, and configuration data is provided to the surrounding design section more efficiently.

Advantageously, the creation of each storage array in the distributed configuration storage can be automated. The specifications for each register bit in each storage array can be presented in tabular form, such as, for example, in a Microsoft Word document. This tabular form can then be compiled using, for example, a Visual Basic script tool that automatically converts the tabular form to an HDL code, such as, for example, VHDL code. Automating the creation of each storage array reduces the potential problem of having unconnected inputs and outputs related to unused storage bits. Unused bits are automatically logically tied to a binary value rather than being stored in a clock-based register such as a flip-flop. In addition, test codes can also be automatically generated for test pattern simulation of a computer system by testing each register bit, and the interconnections to and from each register bit, in configuration storage.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention is directed to systems and methods that provide distributed configuration storage within a device. Devices in a computer system that have configuration storage include, for example, peripheral devices compatible with bus system architectures such as Industry Standard Architecture (ISA), Extended ISA (EISA), and Peripheral Component Interconnect (PCI); a memory-mapped input-output (I/O) space; and any addressable register block (e.g., central processing unit registers). Although the invention applies to any suitable device having configuration storage, the invention is herein described for clarity primarily in the context of configuration storage in PCI compatible devices that conform to a PCI bus architecture.

Figure 1:
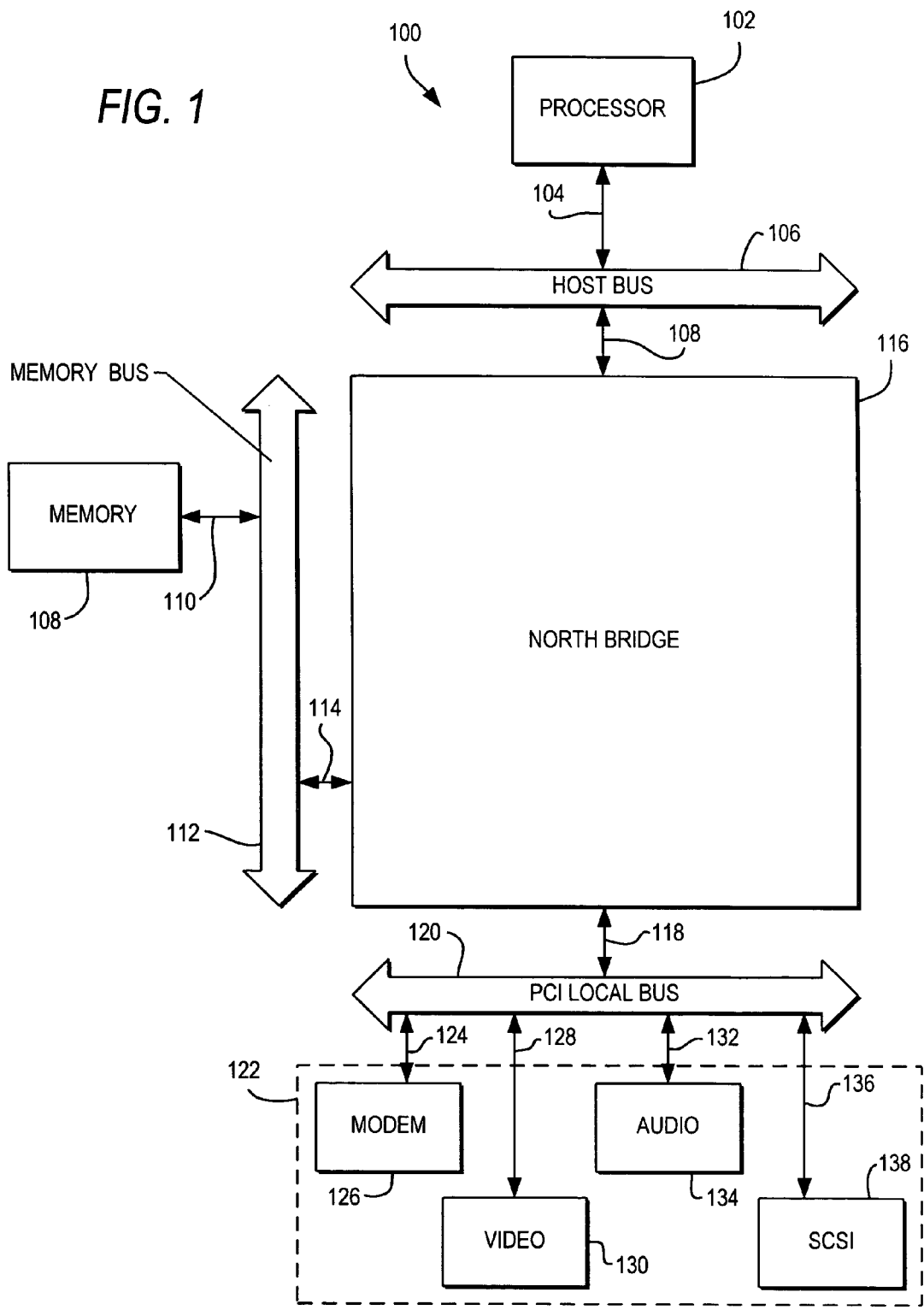
FIG. 1 is a block diagram of a computer system employing PCI bus architecture.

FIG. 1 shows a computer system 100 employing PCI bus architecture. Computer system 100 includes a processor 102, a memory 108, peripheral devices 122, and a chipset 116 (chipset 116 and peripheral devices 122 are herein collectively referred to as PCI compatible devices).

Processor 102, also known as a central processing unit, processes a set of instructions from a stored program. Processor 102 can send data to and receive data from other components in system 100 (e.g., memory 108 and peripheral devices 122) over a host bus 106 via a data path 104.

Memory 108 stores data in the form of binary digits (e.g., binary "1's" and "0's"). Data can be read from, and in some types of memory written to, memory 108 over a memory bus 112 via a data path 110. Memory 108 can be any suitable type of volatile or nonvolatile memory, including, for example, random access memory (RAM), static RAM (SRAM), dynamic RAM (DRAM), synchronous DRAM (SDRAM), magnetic RAM (MRAM), read-only memory (ROM), erasable programmable ROM (EPROM), electronically erasable programmable ROM (EEPROM), and flash memory.

Peripheral devices 122 interface with processor 102 and memory 108 by sending or receiving data over a PCI local bus 120 via data paths 124, 128, 132, and 136. Peripheral devices 122 include a modem 126, a video card 130, an audio card 134, and a small computer system interface (SCSI) 138. Alternatively or additionally, other peripheral devices can be included. The number of peripheral devices 122 in system 100 is typically limited by the number of peripheral devices that PCI local bus 120 can support (e.g., generally 3–5 devices).

Device 116 communicates with processor 102 via a data path 108 and controls interactions with memory 108 via a data path 114 and with peripheral devices 122 over PCI local bus 120 via a data path 118. Device 116 can be, for example, part of the Northbridge/Southbridge chipset (i.e., the Northbridge device), part of the Intel Hub Architecture (IHA), or any other suitable chipset having an architecture that allows the communication of data between processor 102, memory 108, and peripheral devices 122. Alternatively, device 116, processor 102, memory 108, and peripheral devices 122 can communicate directly with PCI local bus 120. For clarity, the invention is described primarily in the context of a Northbridge device.

Data paths 104, 108, 110, 114, 118, 124, 128, 132, and 136 can be any suitable communication paths capable of transmitting data in the form of binary digits. Each data path can be a bi-directional data path or separate unidirectional data path. Each data path can be used to transmit data serially, in parallel, or both serially and in parallel.

Figure 2:
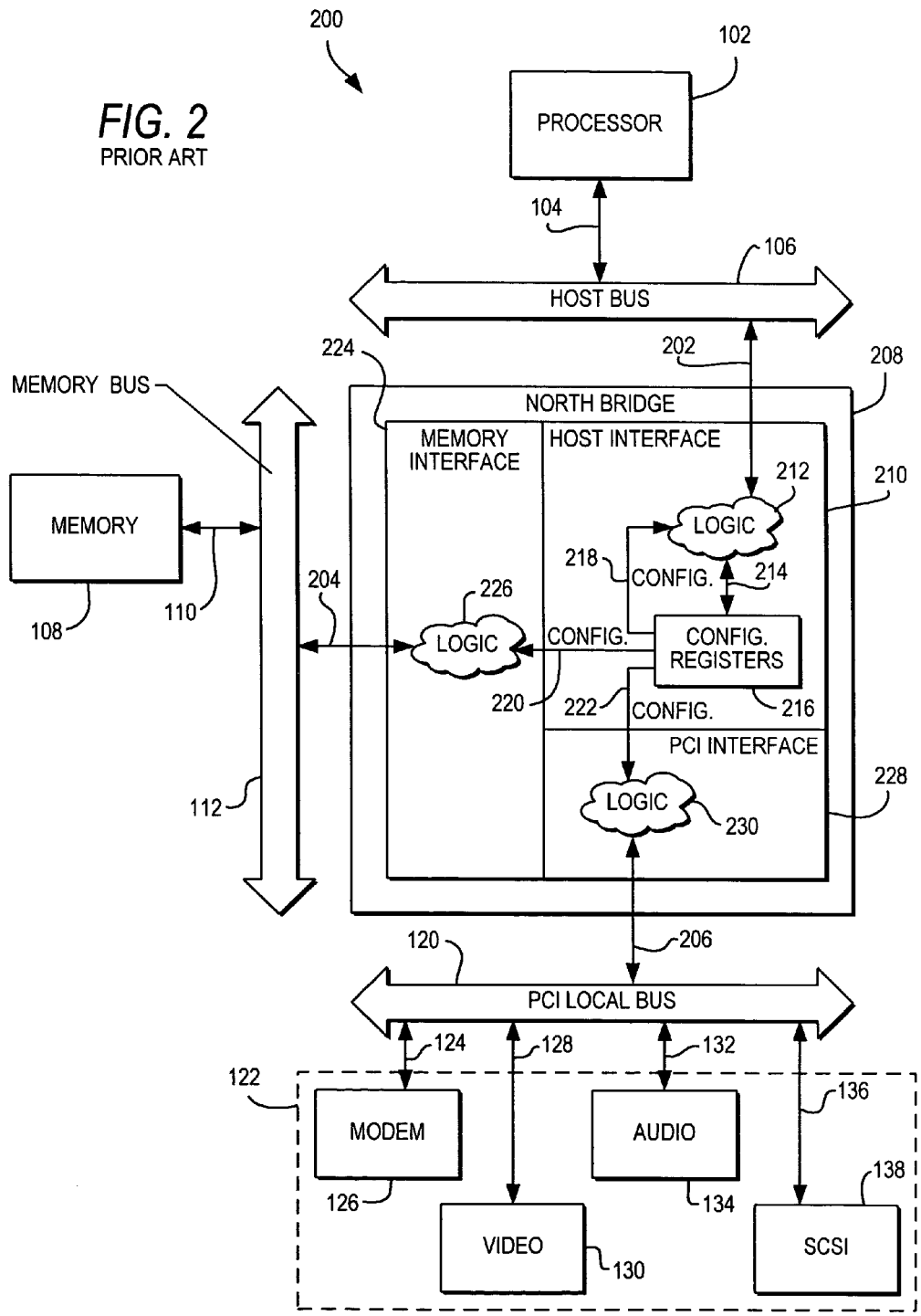
FIG. 2 is a block diagram of a computer system employing PCI bus architecture with centralized configuration storage.

FIG. 2 shows a known computer system 200 employing a PCI bus architecture with centralized configuration storage. A Northbridge device 208 includes several design sections with different functions that can interface with different components in system 200. Such design sections can include, for example, a host interface 210, a memory interface 224, and a PCI interface 228, as well as other design sections or combinations of design sections. Host interface 210 communicates with processor 102 over host bus 106 via a data path 202. Memory interface 224 communicates with memory 108 over memory bus 112 via a data path 204. PCI interface 228 communicates with peripheral devices 122 over PCI local bus 120 via a data path 206. Each interface 210, 224, and 228 can be one design section or can include more than one design section. A design section can be an interface to a component (e.g., processor 102, memory 108, PCI local bus 120) external to the device or internal to the device. Each design section uses configuration information to configure that section of the device. Data paths 202, 204, and 206 can be any suitable communication paths capable of transmitting data.

Each PCI device in computer system 200 (e.g., Northbridge device 218 and peripheral devices 122) has centralized configuration storage. For example, Northbridge device 208 includes configuration registers 216 which are located in host interface 210. Configuration storage includes one or more address spaces each having a suitable number of bytes of addressable memory organized as configuration registers. For example, each address space in a PCI device includes 256 bytes of addressable memory typically implemented as sixty-four 32-bit registers, which make up configuration registers 216. The contents of configuration registers 216 are used to configure each of the design sections (e.g., host interface 210, memory interface 224, and PCI interface 228) in device 208.

Processor 102 issues host requests (e.g., read and write commands) to configuration registers 216 via path 104, host bus 106, path 202, logic 212, and path 214. For configuration registers allocated to host interface 210, configuration data is transmitted from configuration registers 216 to logic 212 via a configuration (CONFIG) bus 218. For configuration registers allocated to memory interface 224, configuration data is transmitted from configuration registers 216 to logic 226 via a CONFIG bus 220. For configuration registers allocated to PCI interface 228, configuration data is transmitted from configuration registers 216 to logic 230 via a CONFIG bus 222.

Logic 212, 226, and 230 allow interfaces 210, 224, and 228, respectively, to be configured to communicate with processor 102, memory 108, and peripheral devices 122, respectively. In addition, logic 212 also accepts host commands from processor 102 over host bus 106 and translates the signals into a form suitable for use by configuration registers 216.

CONFIG buses 218, 220, and 222 provide interfaces 210, 224, and 228, respectively, with access to values stored in configuration registers 216. CONFIG buses 218, 220, and 222 each include enough signal wires to allow configuration bits from configuration registers 216 to be transmitted in parallel to a respective design section. The number of wires in each of CONFIG buses 218, 220, and 222 is at least equal to the number of configuration bits needed by interfaces 210, 224, and 228, respectively, which can include hundreds or thousands of signal wires for each CONFIG bus.

In accordance with the invention, distributed configuration storage is advantageously provided. In one embodiment, configuration storage includes one or more address spaces each having 256 bytes of addressable memory for a device. This memory can be implemented with up to sixty-four 32-bit registers that are byte (i.e., 8-bit) addressable. Although the invention applies to each address space having a suitable number of bytes of addressable memory organized as registers with a suitable number of bits, the invention is herein described for clarity primarily in the context of each address space having 256 bytes of addressable memory organized as 32-bit registers. These registers are preferably implemented with flip-flops because the output states of individual bits may be used as logic inputs. A flip-flop is a storage unit that stores one-data bit and is controlled by a clocking mechanism. Alternatively, the registers may be implemented with other storage devices. While 256 bytes are provided for each address space, not all of the register bits need to be used. Unused register bits can be logically tied to a binary value rather than being stored in such a clock-based register.

Configuration storage can be divided into distributed configuration target (referred to herein as "DCFGT") modules. A target module is physically located within each design section (e.g., a host interface, a memory interface, a PCI interface) of a device that uses configuration registers. These target modules are controlled by a distributed configuration master (referred to herein as "DCFGM") module that is physically located near the host (e.g., processor). The master module and the target modules are self-contained hardware components that each provides a complete function.

The master module translates configuration storage host requests into distributed configuration (DCON) bus commands (e.g., read commands and write commands). The master module interfaces with each target module in the device via a DCON bus.

Each DCON bus transfers commands issued by the host to the corresponding target module. The DCON bus can include, for example, two uni-directional, 8-bit data paths (e.g., for reading data from, and for writing data to, a register) and three control bit paths (e.g., two for signaling a read operation and one for signaling a write operation). Each DCON bus in this embodiment includes about twenty wires that interconnect the master module to a target module located in each design section, which is a significant reduction in the number of wires that interconnect the design sections in comparison to the hundreds or thousands of wires needed to send configuration bits over each CONFIG bus to each design section as required in known systems (e.g., FIG. 2). The DCON bus can be any suitable data path (e.g., uni-directional, bi-directional) for transmitting data bits and control bits.

Each target module includes a DCON bus interface and one or more storage arrays. The DCON bus interface translates DCON bus commands to implement a read operation or a write operation on, for example, a 32-bit register in a storage array (note that registers can be of other bit sizes). A storage array can include one or more 32-bit registers whose configuration bits can be customized for use in the particular design section where the target module resides. The storage array in each target module can include the same registers from the same address space, different registers from the same address space, registers from different address spaces, or any combination thereof. For a same register shared by more than one storage array in different design sections, for example, a bit stored in a register in a storage array of a design section can be copied and stored in a register in a storage array of another design section. In addition, a design section can have more than one storage array. Configuration data needed for a given design section is sent from the target module over a CONFIG bus. Because target modules are located in the design section where they are used, the routing of CONFIG buses is shorter and thus improves efficiency.

Figure 3:
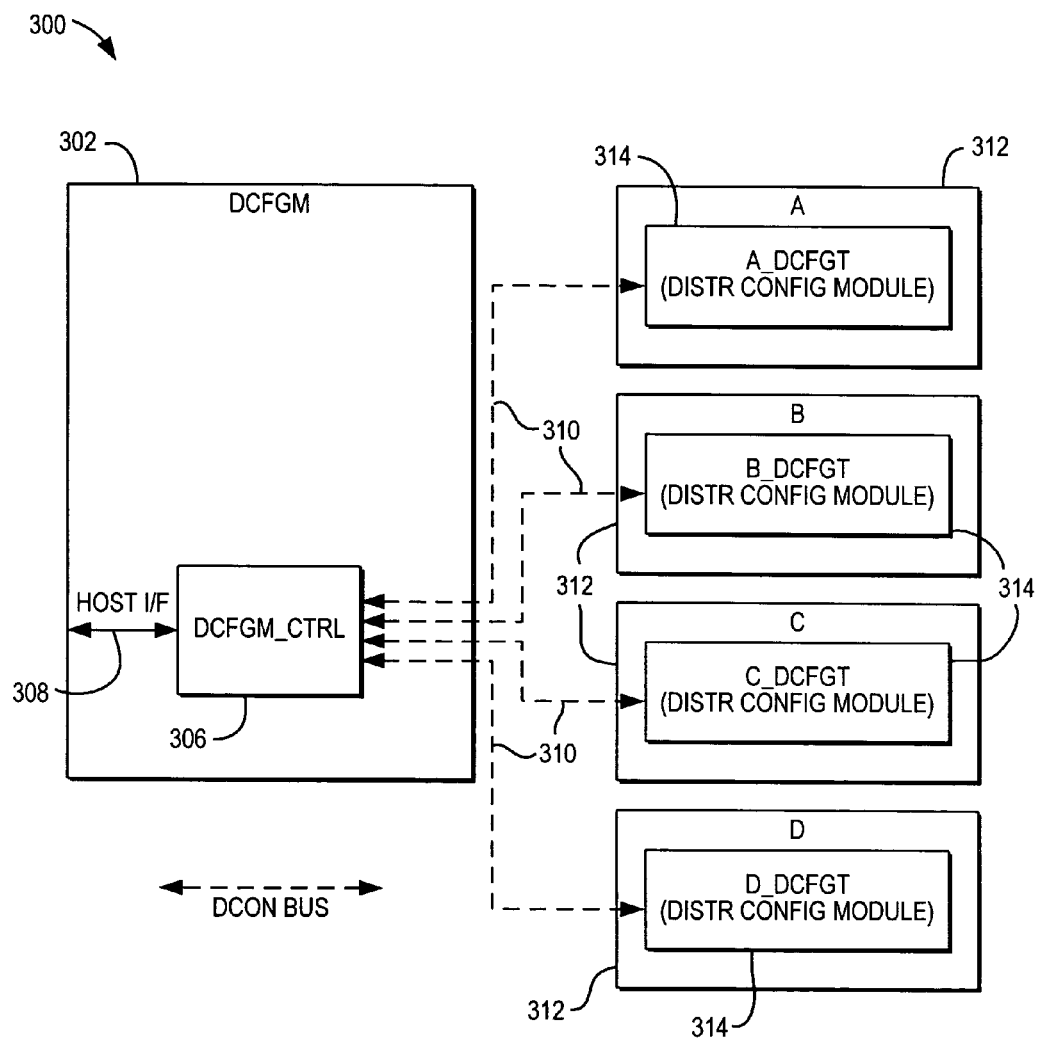
FIG. 3 is a block diagram of distributed configuration storage in accordance with the invention.

FIG. 3 shows distributed configuration storage 300 in either a typical programmable logic device (PLD), application-specific integrated circuit (ASIC), or field-programmable gate array (FPGA) design in accordance with the invention. Distributed configuration storage 300 includes a distributed configuration master (DCFGM) module 302 and one or more design sections (e.g., A, B, C, D) 312 that use configuration registers. Master module 302 can include a distributed configuration master controller (DCFGM_CTRL) submodule 306. DCFGM_CTRL submodule 306 receives requests from a host interface via a data path 308, translates the requests into DCON bus commands, and transmits the commands to one or more distributed configuration target (DCFGT) modules 314 via an associated DCON bus 310.

Figure 4:
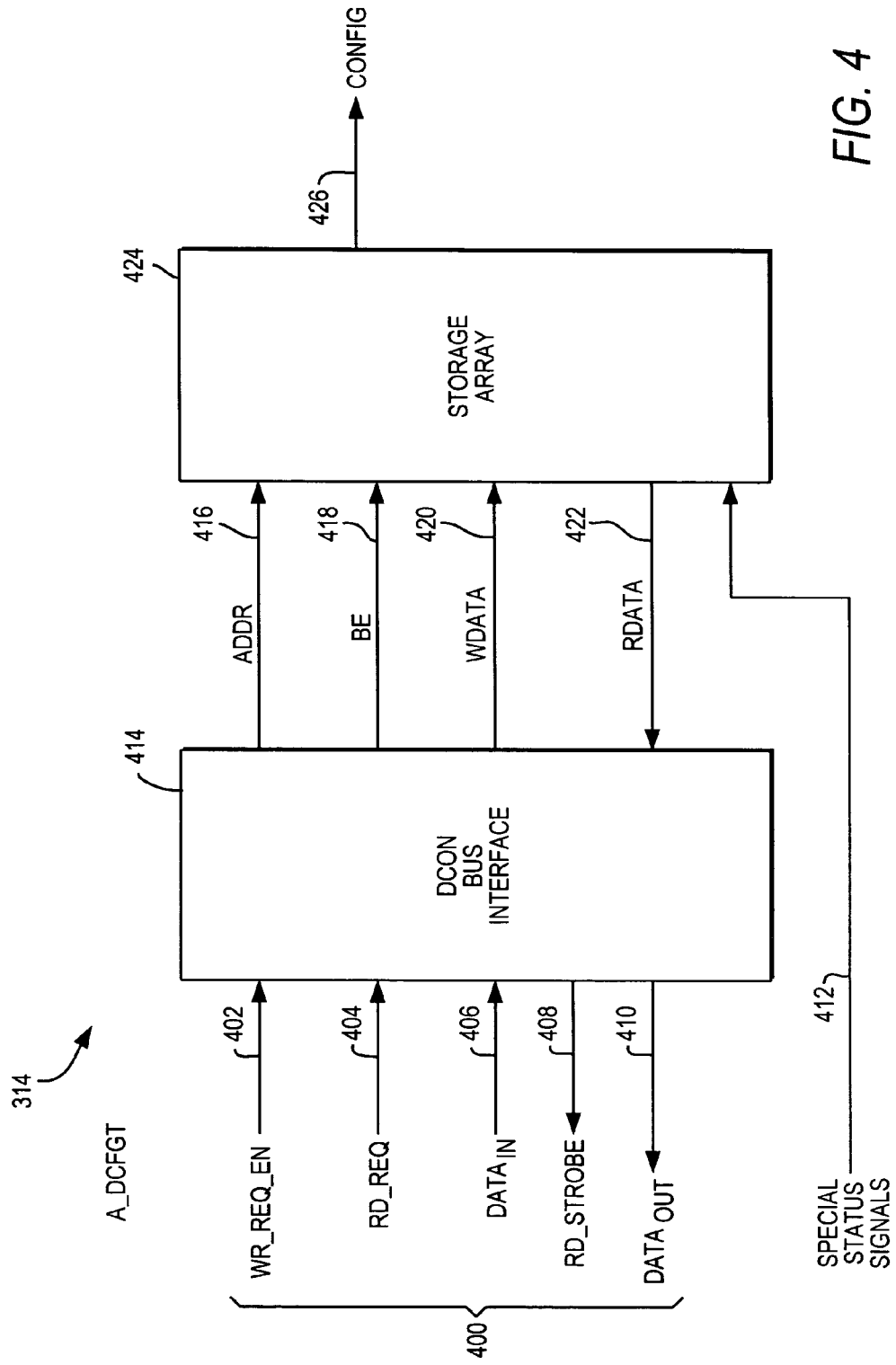
FIG. 4 is a block diagram of a distributed configuration target module in accordance with the invention.

FIG. 4 shows a target module 314 in accordance with the invention. Any data received from or transmitted to target module 314 is sent via input or output ports. Target module 314 includes a DCON bus interface 414 and one or more storage arrays 424.

Signals 400 are sent between master module 302 and DCON bus interface 414 over DCON bus 310 (FIG. 3). Signals 400 can include input signals such as a write request enable (WR_REQ_EN) signal 402, a read request (RD_REQ) signal 404, and an input data (DATA$_{IN}$) signal 406. Signals 400 can also include output signals such as a read strobe (RD_STROBE) signal 408 and an output data (DATA$_{OUT}$) signal 410. WR_REQ_EN signal 402 indicates when a write operation is to be performed and enables the bytes in a given 32-bit address to be written to storage array 424. RD_REQ signal 404 indicates when a read operation is to be performed. DATA$_{IN}$ signal 406 can be used for transferring any one of the following: address information for a write operation, data to be written to one or more bytes in a 32-bit register in storage array 424, or other information. RD_STROBE signal 408 indicates when a read operation is to be performed by signaling when data being transmitted out of DCON bus interface 414 via DATA$_{OUT}$ signal 410 is valid. DATA$_{OUT}$ signal 410 can be used for transferring any one of the following: address information from a read operation, data that has been read from a 32-bit register in storage array 424, or other information. For clarity, DATA$_{IN}$ signal 406 and DATA$_{OUT}$ signal 410 are primarily described herein as 8-bit wide signals, although signals 406 and 410 may be of other suitable widths (e.g., 1 bit, 4 bits, 16 bits, 32 bits). Any other signals or combination of signals for sending configuration commands into target module 314 or for outputting configuration data from target module 314 can also be implemented.

DCON bus interface 414 translates DCON bus signals 402, 404, and 406 into signals 416, 418, and 420, which access one of the 32-bit configuration registers in storage array 424. DCON bus interface 414 can also translate signal 422 from storage array 424 into DCON bus signals 408 and 410 for transmission to master module 302. Address (ADDR) signal 416 indicates which 32-bit register in storage array 424 should be accessed for a read or a write operation. For a 256-byte configuration storage implemented as sixty-four 32-bit registers, each register can be uniquely represented and accessed using a minimum of six bits. For a write operation, byte enable (BE) signal 418 indicates which byte or bytes in the selected 32-bit register is to be written. Each byte in the selected 32-bit register can be represented and accessed using a minimum of two bits, although each byte may also be represented using a unique bit. For example, BE signal 418 may be 4-bits wide with a first bit associated with a most significant byte (MSB) of a given 32-bit register, a second bit associated with a next MSB, a third bit associated with a third MSB, and a fourth bit associated with a least significant byte (LSB). Write data (WDATA) signal 420 can be used for sending write data to a 32-bit register in storage array 424. Read data (RDATA) signal 422 can be used for sending data that has been read from a given 32-bit register in storage array 424. For clarity, the invention is described primarily in the context of accessing a 32-bit register in storage array 424 to perform a read or a write operation. However, any suitable number of 32-bit registers, bytes within a 32-bit register, or registers having a different number of bits can also be accessed.

In some instances, special input signals 412 can be used to store internal hardware status or other information (e.g., status signals., similar signals that can change storage bits independent from the host) in a given storage array 424. These special signals are directly input to storage array 424 and directly control status bits for particular types of registers.

Configuration data from storage array 424 is transmitted out of target module 314 via a CONFIG bus 426 for use by a design section 312. The width of CONFIG bus 426 is preferably equal to the number of configuration bits used by a design section 312.

Storage array 424 includes one or more 32-bit configuration registers. Each register bit can be customized to one of several classes of registers. The different register classes include, for example, read only (R/O), read and write (R/W), write one to clear (R/WOTC), write set once readable (R/WSO), read only status (R/OSTS), read and write status (R/WSTS), and other register class types.

A R/O register allows the host to read from the register. The register is set by hardware and cannot be changed by the host. Configuration of this register is implemented by driving the output of the register to a binary "1" or "0." This type of register is not typically implemented using a flip-flop or other storage unit controlled by a clock.

A R/W register allows the host to read from and write to the register. This type of register is typically implemented using a flip-flop and makes up a majority of the registers in a given storage array.

A R/WOTC register is set internally by a hardware event and is cleared from the host by writing a binary "1." A hardware event is an internal action or occurrence that is detected by system hardware. For example, a hardware event can occur when a data bus is shorted or when an electrical problem occurs that prevents the accurate transmission of data over the data bus. This register has a separate input signal that sets the register when the signal is triggered by the hardware event.

A R/WSO register allows the host to change the register content only when an input control signal is asserted. When the control signal is deasserted, the host is prevented from changing the register content.

A R/OSTS register is set internally by a hardware event and can only be read by the host. The host cannot write to this register. The loading of a status bit into the register is controlled by an input control signal that is triggered by the hardware event.

A R/WSTS register is similar to the R/OSTS register but additionally allows the host to change the content of the register through two separate inputs to the register. The host can read from and write to this register. Any writes performed by the host will override any attempt to load a status bit into the register during a given clock cycle.

Figure 5A:
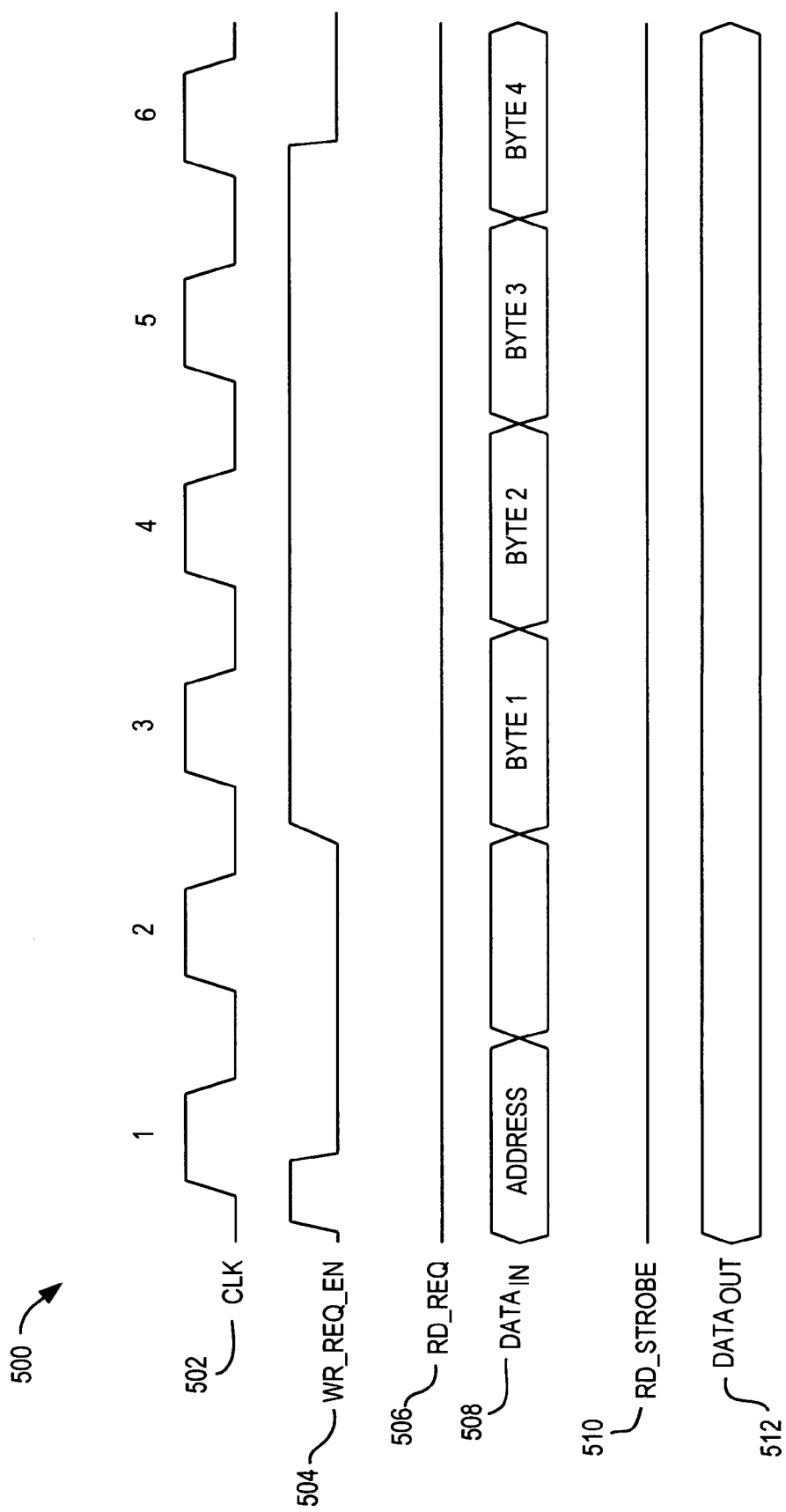
FIGS. 5A–B are timing diagrams illustrating write operations in the target module of FIG. 4 in accordance with the invention.

FIG. 5A shows timing 500 of a write operation to target module 314 in FIG. 4. Signals 504, 506, 508, 510, and 512 are transmitted over DCON bus 310. In a first clock cycle of a write operation, WR_REQ_EN signal 504 is asserted (e.g., set to binary "1") and an address of a 32-bit register in storage array 424 is transmitted over $DATA_{IN}$ signal 508. These signals are preferably appropriately set just prior to a clock edge and remain set for a predetermined time period in order for these signals to be retrieved by DCON bus interface 414. Data can be retrieved by DCON bus interface 414 during a rising edge. (e.g., from binary "0" to "1"), a falling edge (e.g., from binary "1" to "0"), or both a rising and falling edge of CLK signal 502. For clarity, data is described primarily herein as being is retrieved during a rising edge of CLK signal 502.

In a second clock cycle, also referred to as a turn-around phase, WR_REQ_EN signal 504 is deasserted (e.g., set to binary "0") and no data is transmitted over $DATA_{IN}$ signal 508. This phase may be optional or may require more than one clock cycle depending on the time needed to implement a write operation at a given address.

Figure 5B:
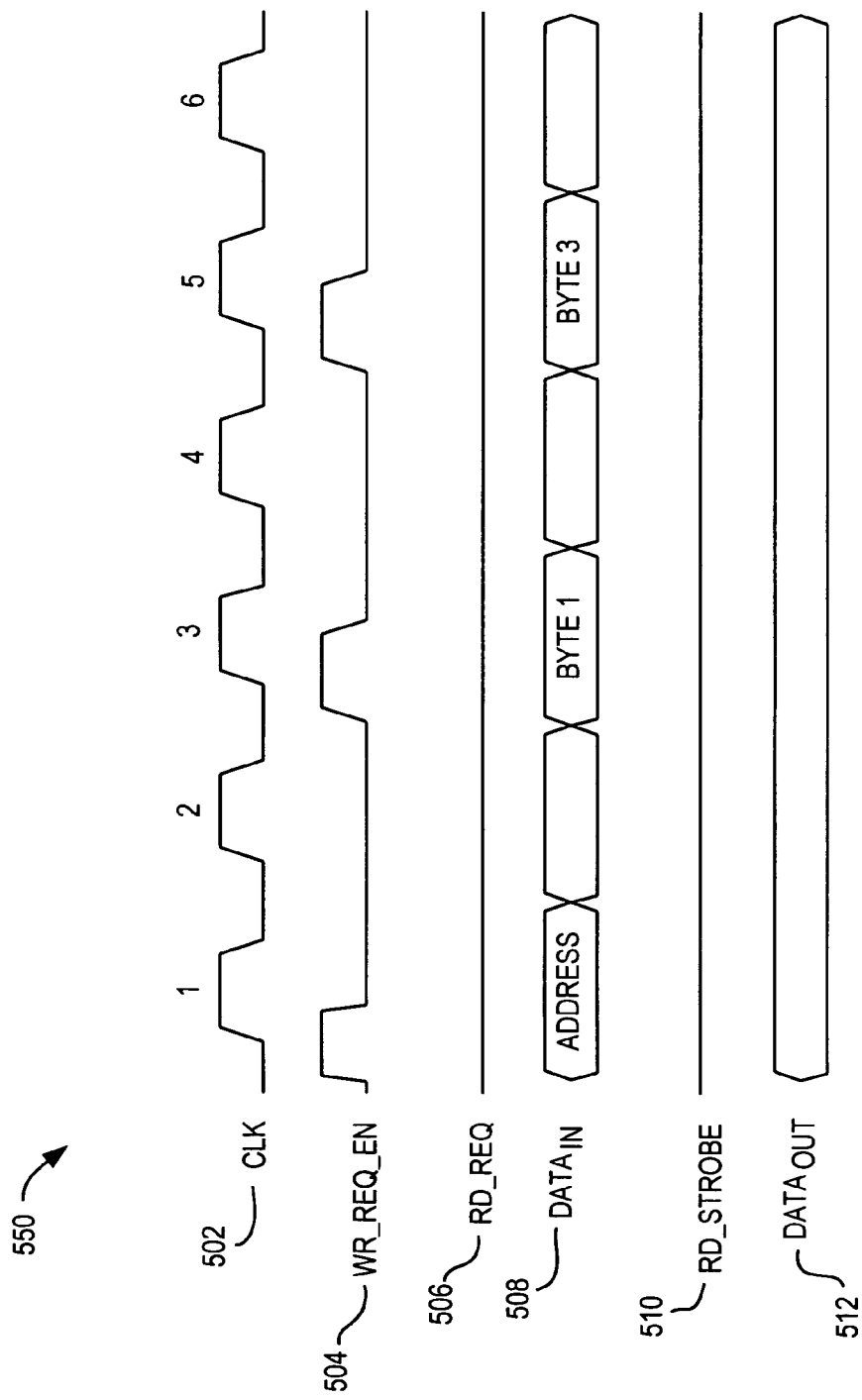

In a third clock cycle, WR_REQ_EN signal 504 is asserted to enable a byte of data being transmitted over $DATA_{IN}$ signal 508 to be written to the given address. For 8-bit wide $DATA_{IN}$ signal 508 that sends data to a 32-bit register in storage array 424, four bytes of data can be sent over DCON bus 310 over four clock cycles. Data can be sent over DCON bus 310 from least significant byte (LSB) to most significant byte (MSB), from MSB to LSB, or in any other order. If four bytes of data are to be written to the 32-bit register at the given address, WR_REQ_EN signal 504 remains asserted for clock cycles 4–6. If less than four bytes are to be written to the 32-bit register, WR_REQ_EN signal 504 is deasserted during those clock cycles corresponding to a byte location that is not to be written to. FIG. 5B shows timing 550 of a write operation on bytes 1 and 3 at the given address. WR_REQ_EN signal 504 is deasserted during clock cycles 4 and 6, which correspond to bytes 2 and 4, respectively. RD_REQ signal 506, RD_STROBE signal 510, and $DATA_{OUT}$ signal 512 are not used in a write operation and preferably remain deasserted.

Figure 6:
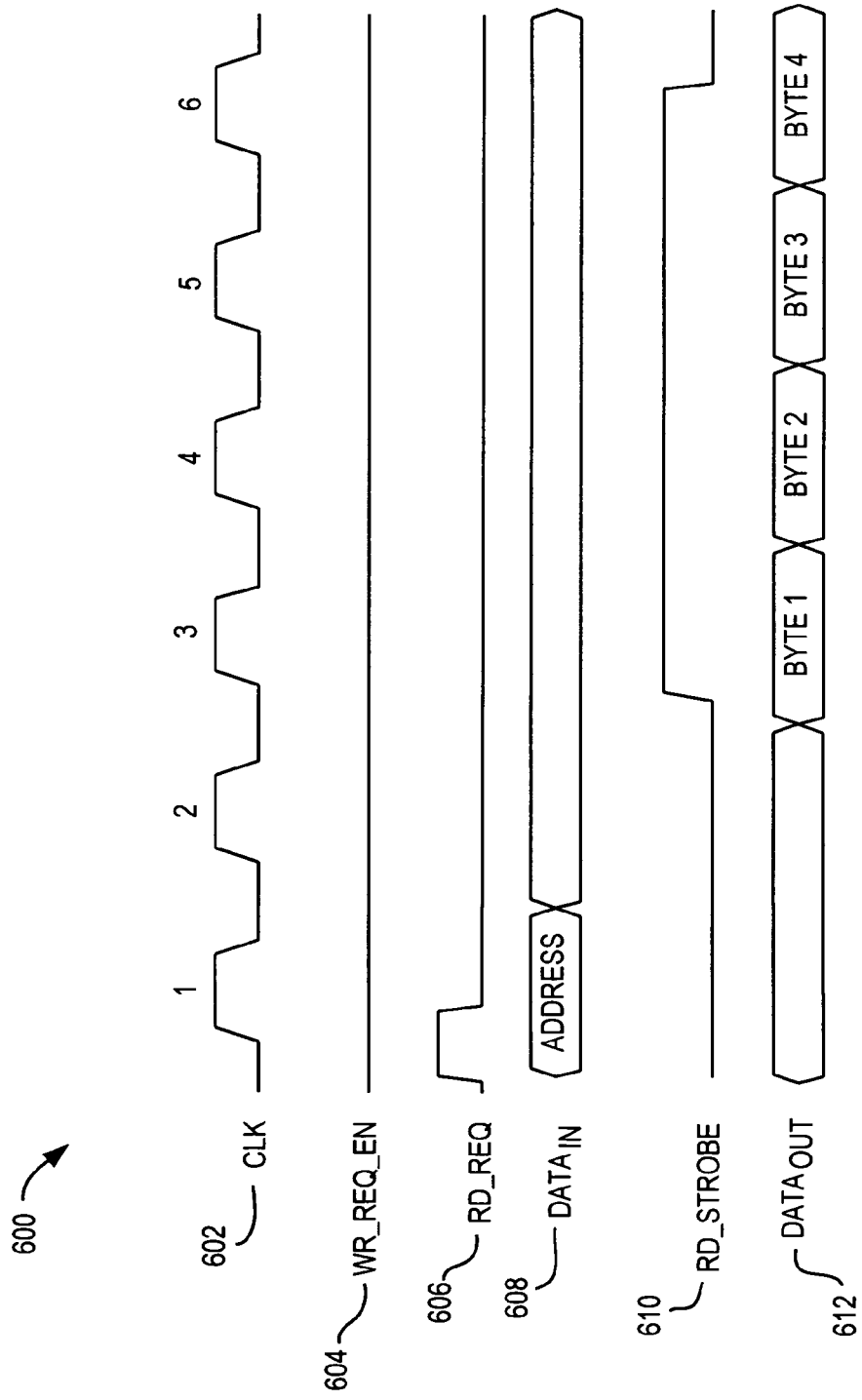
FIG. 6 is a timing diagram illustrating a read operation in the target module of FIG. 4 in accordance with the invention.

FIG. 6 shows timing 600 of a read operation to target module 314. Signals 604, 606, 608, 610, and 612 are transmitted over DCON bus 310. Data may be captured by DCON bus interface 414 or master module 302 during, for example, a rising edge of a CLK signal 602. In a first clock cycle of a read operation, RD_REQ signal 606 is asserted and an address of a register in storage array 424 is transmitted over $DATA_{IN}$ signal 608.

In a second clock cycle, during a turn-around phase, RD_REQ signal 504 is deasserted and no data is transmitted over $DATA_{OUT}$ signal 612. This phase may be optional or may require more than one clock cycle depending on the time needed to implement a read operation from a given address.

In a third clock cycle, data that has been read from a 32-bit register at the given address is transmitted over $DATA_{OUT}$ signal 612. RD_STROBE signal 610 is also asserted to indicate that valid data is being transmitted. RD_STROBE signal 610 remains asserted until a last byte of data has been sent to master module 302.

Figure 7:
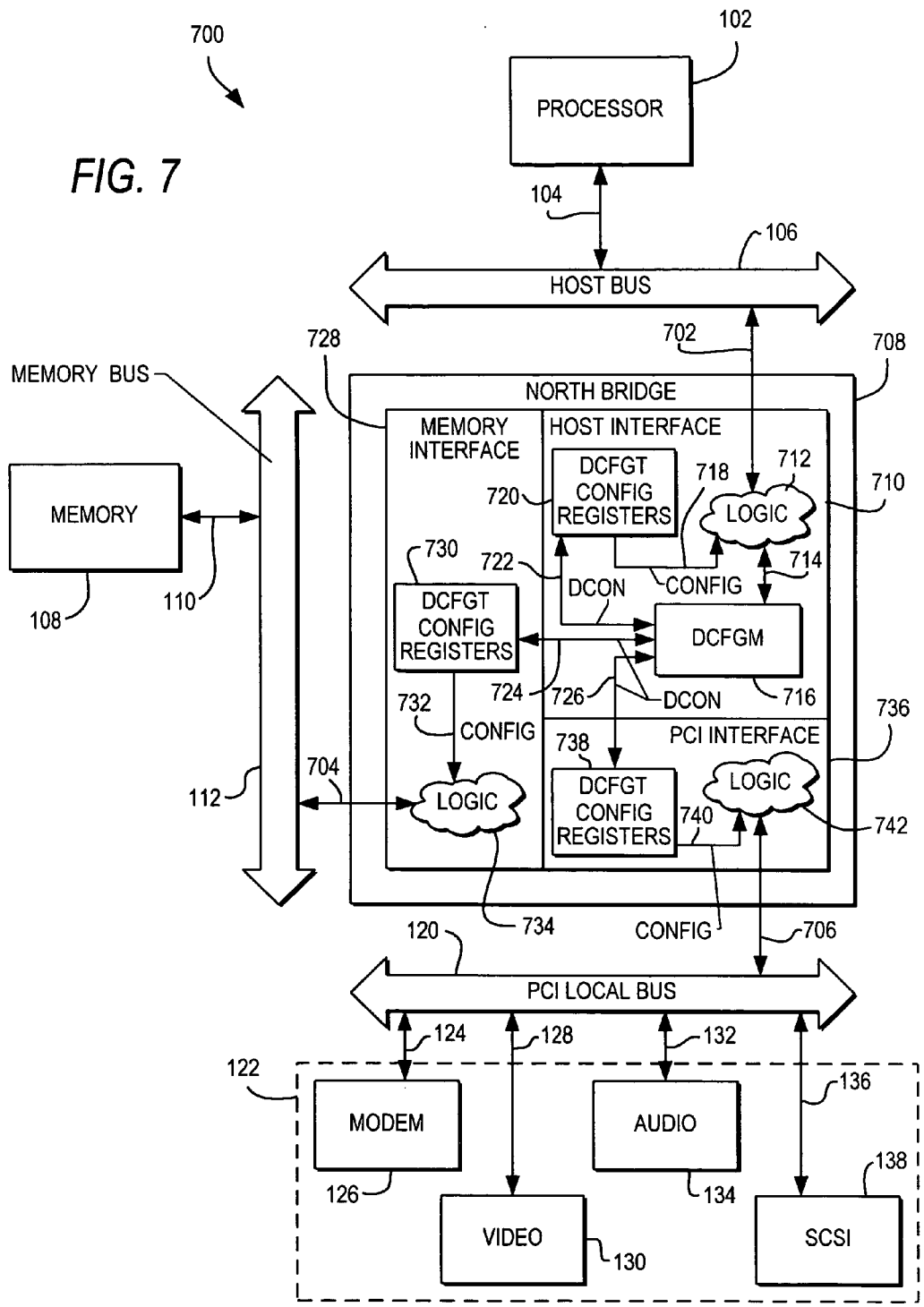
FIG. 7 is a block diagram of a computer system employing PCI bus architecture with distributed configuration storage in accordance with the invention.

FIG. 7 shows a computer system 700 employing a PCI bus architecture with distributed configuration storage in accordance with the invention. Northbridge device 708 can include design sections such as a host interface 710, a memory interface 728; and a PCI interface 736 that interface with components in system 700. Host interface 708 communicates with processor 102 over host bus 106 via a data path 702. Memory interface 728 communicates with memory 108 over memory bus 112 via a data path 704. PCI interface 736 communicates with PCI local bus 120 via a data path 706. Northbridge device 708 can include other interfaces to communicate with other components in system 700.

Processor 102 issues host requests to master module 716 in host interface 710 via the following: path 104, host bus 106, path 702, distributed configuration module logic 712, and path 714. Master module 716 translates the host requests into DCON bus commands for transmission over one or more of DCON buses 722, 724, and 726 to one or more corresponding target modules 720, 730, and 738, respectively, depending on which design section is to be accessed. Configuration data from one or more target modules 720, 730, and 738 can then be transmitted over CONFIG buses 718, 732, and 740 to distributed configuration module logic 712, 734, and 742 for use by interfaces 710, 728, and 736, respectively.

Figure 8:
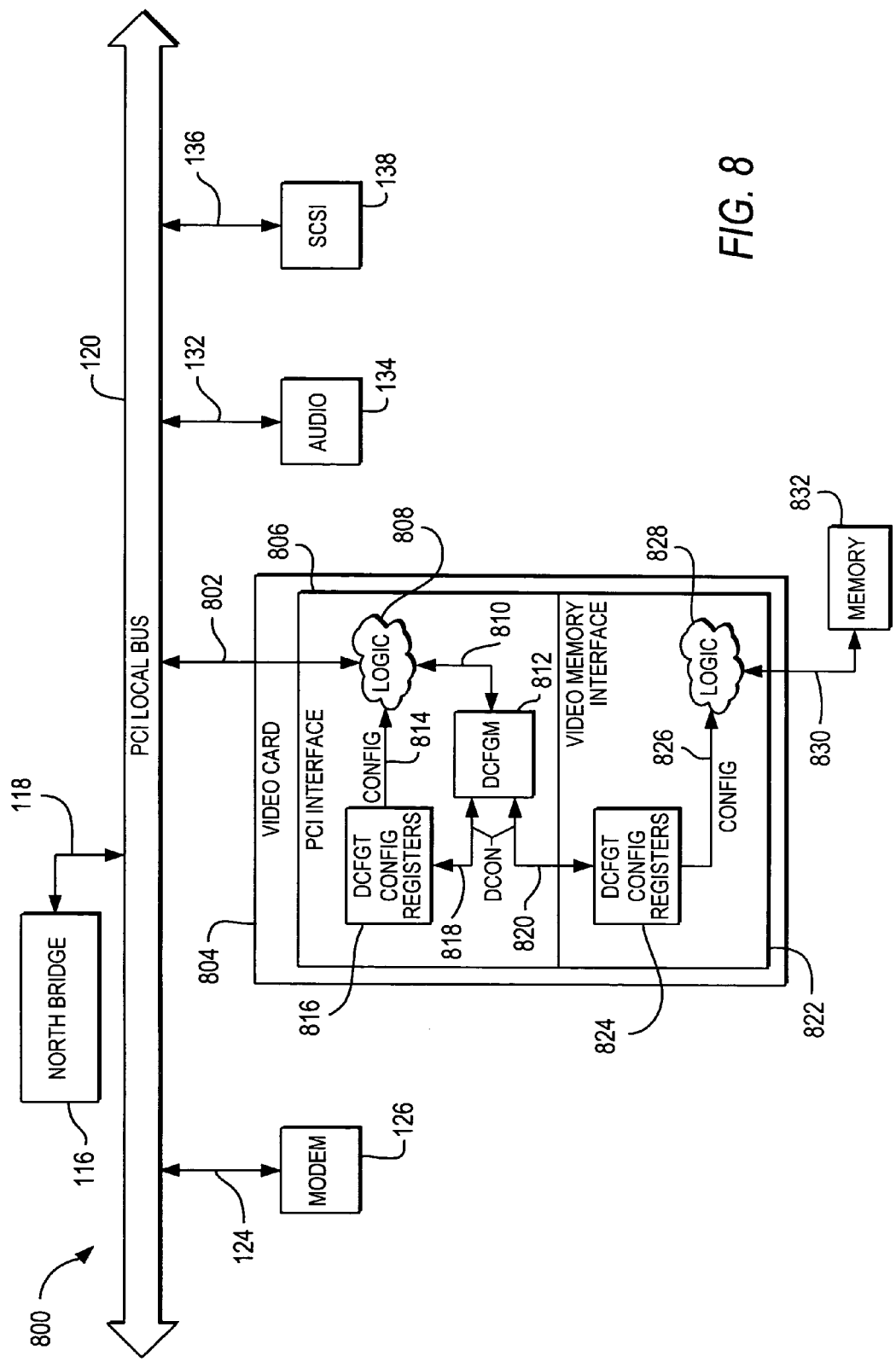
FIG. 8 is a block diagram of a portion of a computer system employing PCI bus architecture with distributed configuration storage in accordance with the invention.

FIG. 8 shows part of a computer system 800 employing a PCI bus architecture with distributed configuration storage in accordance with the invention. In addition to Northbridge device 116, peripheral devices interfacing with PCI local bus 120 also have configuration storage. For example, a video card 804 can include one or more design sections such as a PCI interface 806 and a video memory interface 822 that interface with components in system 800. PCI interface 808 communicates with PCI local bus 120 via a data path 802. Video memory interface 822 communicates with a video memory 832 via a data path 830. Video memory 832 can be any suitable storage device capable of storing graphics. Video card 804 can include any suitable interfaces that communicate with other components in system 700.

Host requests can be issued via PCI local bus 120 to master module 812 in PCI interface 806 via path 802, logic 808, and path 810. Master module 812 translates the host requests into DCON bus commands for transmission over one or more of DCON buses 818 and 820 to one or more corresponding target modules 816 and 824, respectively, depending on which design section is to be accessed. Configuration data from one or more of target is modules 816 and 824 can then be transmitted over CONFIG buses 814 and 826 to distributed configuration module logic 808 and 828 for use by interfaces 806 and 822, respectively.

In accordance with the invention, the process of creating distributed configuration storage with customizable register bits can be automated. This can be done by first documenting the specifications for each register bit. For example, the register classification for each register bit in each storage array is described using a tabular format in a document such as a Microsoft Word document. Each tabular format can then be converted, via a process known as scripting, to HDL code. In scripting, a program or a sequence of instructions is executed to process input data (e.g., the tabular formats in the Word document). The program can be written in any script language including, for example, Visual Basic, Perl, and JavaScript. The HDL code can include, for example, VHDL code or Verilog code that contains hardware information to represent each storage array with the customized register bits.

A tabular format can be used to define each configuration register arranged in a storage array. Each storage array can be described using one or more tables. A table can define any number of registers bits (e.g., 1 byte, 2 bytes, 3 bytes, 4 bytes, 8 bytes, etc.) that ends on a byte boundary. Table 1 below is an example describing four bytes of configuration registers in a given storage array.

TABLE 1

Host-PCI I/O Range #1

Address: 0x64-0x67   Symbol: HPIOR1   Usage: A

| Bits | Field Name | Description | Properties | Reset |
|---|---|---|---|---|
| 31:28 |  | Reserved. | R/O | 0x0 |
| 27:16 | StartPIORange | Start of PCI I/O range in 16-byte increments. Address bits [15:4] must be greater than or equal to the value in this field. | R/W | 0xFFF |
| 15:12 |  | Reserved | R/O | 0x0 |
| 11:0 | EndPIORange | End of PCI I/O range in 16-byte increments. Address bits [15:4] must be less than or equal to the value in this field | R/W | 0x000 |

The "Address" field indicates the byte address range (e.g., 0x64–0x67) for which the table's description applies. A 32-bit (i.e., 4-byte) register is described in Table 1. The "Symbol" field indicates the name of the register defined by the address field. The "Usage" field indicates the storage array (e.g., A) that includes these registers. The "Bits" field identifies the bit range in the 32-bit register of the function being described (e.g., bits 31:28, 27:16, 15:12, and 11:0). The "Field Name" is an identifier for the bit ranges identified in the corresponding "Bits" field. The "Description" field describes the functions controlled by the bits within a field. The "Properties" field identifies the class of register bits. For example, bits 31:28 and 15:12 are read only (R/O) registers and bits 27:16 and 11:0 are read and write (R/W) registers. Because not all registers in configuration storage need to be used, registers not included in the tables can be designed to output, for example, a binary "0."

Figure 9:
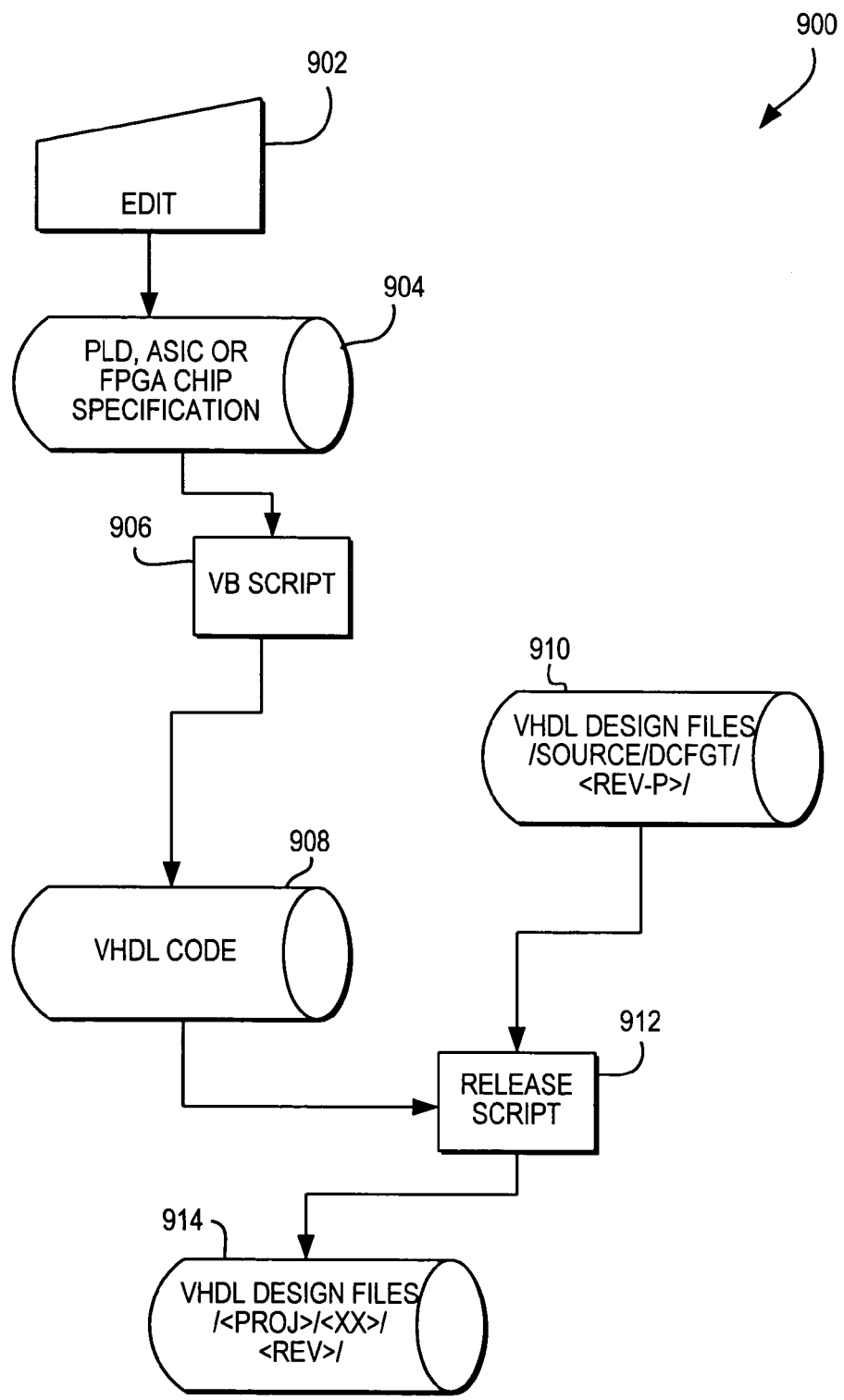
FIG. 9 is a flow chart of automatic creation of distributed configuration storage for a device in accordance with the invention.

FIG. 9 shows automated process 900 that creates distributed configuration storage in accordance with the invention. At 902, a tabular format that includes a description of each register bit used in configuration storage is created. At 904, these tabular formats are integrated into a PLD, ASIC, or an FPGA chip specification for each design section in the device. The chip specification is also preferably in a Word document. At 906, a Visual Basic (VB) script is executed on the chip specification to generate VHDL code.

The VHDL code at 908 is combined with VHDL design files 910 and the resulting script is released at 912. VHDL design files 910 are templates that include VHDL code for sections of a device that do not change from design section to design section, or from device to device. Instead of adding these sections to the chip specification and executing the VB script on these sections each time, the VHDL code for these sections are stored in separate VHDL design files. The resulting VHDL code for the device is stored in VHDL design files at 914.

The invention advantageously automates the process of creating customizable and classifiable configuration registers. Each storage array can include any combination of register classes. In addition, registers that are not used automatically output a binary "0" when accessed, preventing the possibility of having unconnected inputs or outputs related to unused register bits.

Logic simulation can also be automated in accordance with the invention. Because information about register classifications is stored using a tabular format, logic simulation can be customized to test the unique qualities of each register and to verify the interconnectivity to and from each register (e.g., path 702, logic 712., path 714, master module 716, DCON bus 722, target module 720, and CONFIG 718). A separate VB script can be used to create test code for simulating is test patterns necessary to validate each storage array in a system environment. For example, for a read only register, test code can be created that attempts to write a value to such a register and then reads from that register to determine whether the interconnections to the register are functioning properly and whether the register was erroneously written to.

Thus it is seen that systems and methods are provided for improving the layout efficiency and logic design accuracy of configuration storage in a device. One skilled in the art will appreciate that the invention can be practiced by other than the described embodiments, which are presented for purposes of illustration and not of limitation, and the invention is limited only by the claims which follow.

We claim:

1. A method of providing configuration storage in a device, said method comprising:
    placing subsets of said configuration storage in physically non-contiguous areas on said device corresponding to interfaces of said device that each use configuration storage, wherein each said interface comprises:
        a processor interface comprising a first subset of said subsets of configuration storage,
        a memory interface comprising a second subset of said subsets of configuration storage, and
        a system bus interface comprising a third subset of said subsets of configuration storage;
    receiving information in a tabular format regarding at least one register bit in said configuration storage for each interface of said device that uses configuration storage; and
    scripting said tabular format into a hardware description language (HDL) code containing hardware information for said register bit.

2. The method of claim 1 wherein said receiving information comprises receiving information in a tabular format to configure said register bit to be one of a read only register, a read and write register, a write one to clear register, a write set once and readable register, a read only status register, and a read and write status register.

3. The method of claim 1 further comprising setting said register bit to indicate one of a read only register, a read and write register, a write one to clear register, a write set once and readable register, a read only status register, and a read and write status register.

4. The method of claim 1 further comprising receiving information for register bits for each interface that uses configuration storage in different tabular formats.

5. The method of claim 1 wherein said scripting comprises scripting said tabular format into HDL code using a Visual Basic script tool.

6. The method of claim 1 wherein said scripting comprises scripting said tabular format into HDL code using a Perl script tool.

7. The method of claim 1 wherein said HDL code is Very High Speed Integrated Circuit HDL code.

8. The method of claim 1 wherein said HDL code is Verilog code.

9. The method of claim 1 further comprising automatically creating test code to generate test patterns for simulating said configuration storage in a system environment.

10. A method for providing configuration storage in a device, said method comprising:
   receiving information in a tabular format regarding at least one register bit in said configuration storage for a host interface, a memory interface, and a system bus interface of said device where each interface uses a respective subset of configuration storage, and where none of said subsets of said configuration storage is physically contiguous with any other of said subsets of said configuration storage;
   scripting said tabular format into a hardware description language (HDL) code containing hardware information for said register bit; and
   combining said HDL code with an HDL design file, wherein said HDL design file comprises HDL code for predefined sections of the device, and further wherein said combining eliminates unconnected inputs and outputs in said device.

11. The method of claim 10 wherein said receiving information comprises receiving information in a tabular format to configure said register bit to be one of a read only register, a read and write register, a write one to clear register, a write set once and readable register, a read only status register, and a read and write status register.

12. The method of claim 10 further comprising setting said register bit to indicate one of a read only register, a read and write register, a write one to clear register, a write set once and readable register, a read only status register, and a read and write status register.

13. The method of claim 10 further comprising receiving information for register bits for each interface that uses configuration storage in different tabular formats.

14. The method of claim 10 further comprising automatically creating test code to generate test patterns for simulating said configuration storage in a system environment.

15. The method of claim 10 further comprising automatically logically tying unused register bits in said configuration storage to a binary value.

16. A method for providing configuration storage in a device, said method comprising:
   receiving information in a tabular format regarding at least one register bit in said configuration storage for a host interface, a memory interface, and a system bus interface of said device where each interface uses a respective subset of configuration storage, and where none of said subsets of said configuration storage is physically contiguous with any other of said subsets of said configuration storage;
   integrating said tabular format into a chip specification for each interface of said device that uses said configuration storage;
   scripting said chip specification into a hardware description language (HDL) code containing hardware information for said chip specification; and
   combining said HDL code with an HDL design file, wherein said HDL design file comprises HDL code for predefined sections of the device, and further wherein said combining eliminates unconnected inputs and outputs in said device 17. The method of claim 16 further comprising combining said HDL code with at least one HDL design file, wherein said HDL design file is a template comprising HDL code for at least one section of said device that does not change between each design section.

18. The method of claim 17 further comprising releasing and storing said combined HDL code and HDL design file in a second HDL design file.

19. The method of claim 18 further comprising:
   importing said second HDL design file into a place-and-route tool;
   generating a netlist that describes electrical connectivity data of said device based on said second HDL design file; and
   fabricating said device on a chip based on the netlist.

20. The method of claim 19 wherein said chip comprises one of a programmable logic device, an application-specific integrated circuit, and a field-programmable gate array.

21. Data processing apparatus comprising:
   means for receiving information in a tabular format regarding at least one register bit in said configuration storage for a host interface, a memory interface, and a system bus interface of said device where each interface uses a respective subset of configuration storage, and where none of said subsets of said configuration storage is physically contiguous with any other of said subsets of said configuration storage;
   means for scripting said tabular format into a hardware description language (HDL) code containing hardware information for said register bit; and
   means for combining said HDL code with an HDL design file, wherein said HDL design file comprises HDL code for predefined sections of the device, and further wherein said combining eliminates unconnected inputs and outputs in said device 22. Data processing apparatus comprising:
   means for receiving information in a tabular format regarding at least one register bit in said configuration storage for a host interface, a memory interface, and a system bus interface of said device where each interface uses a respective subset of configuration storage, and where none of said subsets of said configuration storage is physically contiguous with any other of said subsets of said configuration storage;
   means for integrating said tabular format into a chip specification for each interface of said device that uses said configuration storage;
   means for scripting said chip specification into a hardware description language (HDL) code containing hardware information for said chip specification; and
   combining said HDL code with an HDL design file, wherein said HDL design file comprises HDL code for predefined sections of the device, and further wherein said combining eliminates unconnected inputs and outputs in said device.

* * * * *